United States Patent
Choi (10) Patent No.: US 10,193,532 B2
(45) Date of Patent: Jan. 29, 2019

(54) METHOD OF OPERATING A FINITE IMPULSE RESPONSE FILTER

(71) Applicant: Agency for Science, Technology and Research, Singapore (SG)

(72) Inventor: Jaeyoung Choi, Singapore (SG)

(73) Assignee: AGENCY FOR SCIENCE, TECHNOLOGY AND RESEARCH, Singapore (SG)

(*) Notice: Subject to any disclaimer, the term of this patent is extended or adjusted under 35 U.S.C. 154(b) by 126 days.

(21) Appl. No.: 15/310,666

(22) PCT Filed: Jun. 10, 2015

(86) PCT No.: PCT/SG2015/050154
§ 371 (c)(1),
(2) Date: Nov. 11, 2016

(87) PCT Pub. No.: WO2015/191005
PCT Pub. Date: Dec. 17, 2015

(65) Prior Publication Data
US 2017/0077905 A1    Mar. 16, 2017

(30) Foreign Application Priority Data
Jun. 10, 2014 (SG) .......................... 10201403092X (51) Int. Cl.
*H03H 17/02* (2006.01)
*H03H 15/00* (2006.01)
(Continued)

(52) U.S. Cl.
CPC ......... *H03H 17/0223* (2013.01); *G06F 17/10* (2013.01); *H03H 15/023* (2013.01); *H03H 17/06* (2013.01)

(58) Field of Classification Search
CPC .. H03H 17/0223; H03H 15/023; H03H 17/16; G06F 17/10
(Continued)

(56) References Cited

U.S. PATENT DOCUMENTS 5,325,322 A * 6/1994 Bailey .................... H03H 15/00
                                                     708/819
5,563,819 A * 10/1996 Nelson ................... H03H 15/02
                                                     708/819
(Continued)

OTHER PUBLICATIONS

International Search Report for PCT/SG2015/050154, 4 pages (dated Sep. 7, 2015).
(Continued)

*Primary Examiner* — Tan V Mai
(74) *Attorney, Agent, or Firm* — Choate, Hall & Stewart LLP (57) ABSTRACT

According to one aspect of the invention, there is provided a method of operating a finite impulse response filter comprising an input; an output; and a plurality of storage elements, each coupled to the input via a sample switch and to the output via a transfer switch, the method comprising: during charging of the plurality of storage elements, applying a sample clock signal to each of the sample switches that achieves an operation mode where up to every one of the sample switches is simultaneously closed to connect all of the plurality of storage elements to the input; and during averaging of the plurality of storage elements, applying a transfer clock signal to each of the transfer switches to close one or more of the transfer switches to connect the storage elements, having charge stored therein, to the output.

18 Claims, 9 Drawing Sheets

(51) Int. Cl.
*G06F 17/10* (2006.01)
*H03H 17/06* (2006.01)

(58) Field of Classification Search
USPC .......................................... 708/819, 300–323
See application file for complete search history.

(56) References Cited

U.S. PATENT DOCUMENTS

| | | | | |
|---|---|---|---|---|
| 6,032,171 | A * | 2/2000 | Kiriaki | H03H 15/00 708/316 |
| 7,664,811 | B2 * | 2/2010 | Matsuoka | H03H 15/00 708/819 |
| 2009/0021297 | A1 * | 1/2009 | Yoshizawa | H03H 15/023 327/554 |
| 2009/0134938 | A1 * | 5/2009 | Iida | H03H 15/00 327/554 |
| 2009/0160577 | A1 * | 6/2009 | Yoshizawa | H03H 15/023 333/174 |
| 2009/0322580 | A1 | 12/2009 | Belveze et al. | |
| 2009/0327793 | A1 | 12/2009 | Kim et al. | |
| 2013/0120033 | A1 * | 5/2013 | Huang | H03H 15/023 327/146 |

OTHER PUBLICATIONS

Written Opinion for PCT/SG2015/050154, 4 pages (dated Sep. 7, 2015).

* cited by examiner

METHOD OF OPERATING A FINITE IMPULSE RESPONSE FILTER

TECHNICAL FIELD

The present invention relates to a method of operating a finite impulse response filter and a RF system comprising such a finite impulse response filter.

BACKGROUND ART

Discrete time (DT) filters, which can be used to implement software defined radio (SDR), allows for the support of different wireless standards. DT filters replace receiver blocks such as a mixer, a RF (radio frequency) baseband filter and amplifier, and enjoy inherent tunability which arises from sampling.

Figure 1:
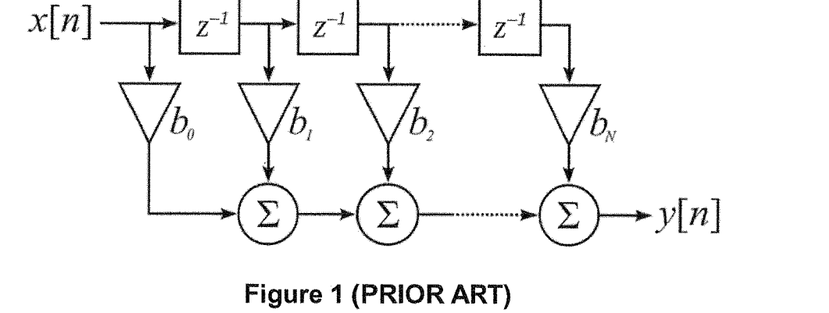
FIG. 1 shows a schematic of a prior art digital finite impulse response (FIR) filter.

DT receivers usually include DT finite impulse response (FIR) filters to decimate an input sample rate. The DT FIR filter can be understood as an analog version of the digital FIR filter. For a digital FIR filter, each output value is a weighted sum of the successive input values as illustrated in FIG. 1.

Figure 2:
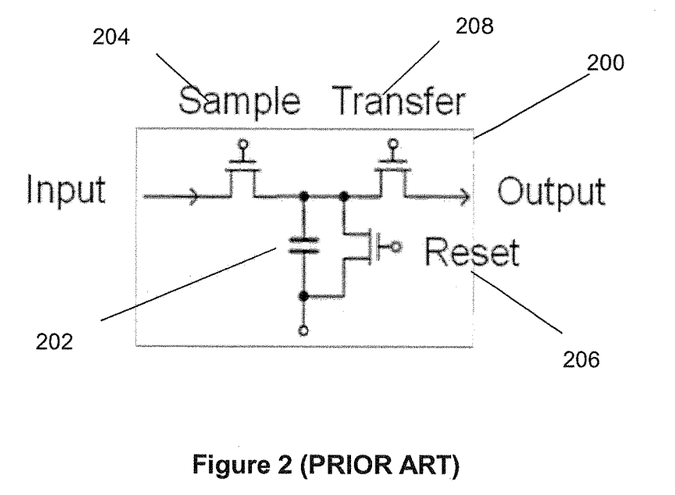
FIG. 2 shows a sampling unit of a discrete time (DT) filters in accordance with a prior art design.

To implement similar function in the analog domain, DT filters use multiple numbers of a sampling unit 200 shown in FIG. 2. Each unit 200 comprises one capacitor 202 and at least three switches 204, 206 and 208. The sample switch 204 implements time delay. FIR coefficients are implemented by the ratio of the capacitor 202 with the capacitor 202 of one or more other sampling units 200. Summation is achieved by connecting the capacitors 202 using the transfer switch 208. Finally, the capacitor 202 is reset by the reset switch 206 for the next input stream.

Figure 3:
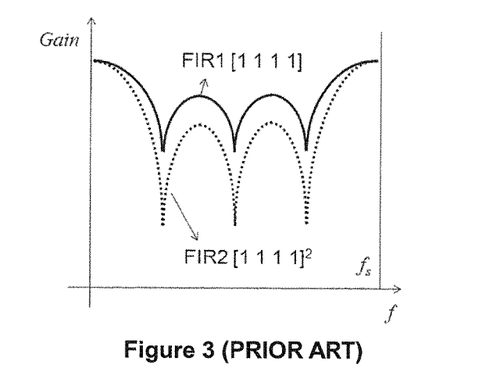
FIG. 3 shows a frequency response of a typical DT filter.

The frequency response of a typical DT filter is shown in FIG. 3, where $f_s$ is the input sample rate. Curve FIR1 plots the frequency response of a 4-tap moving average filter (coefficient [1 1 1 1]), which is chosen as the example for further discussion. To increase filter rejection, the order may be increased, as shown in dotted curve FIR2.

In H. Seo et. al., "A Wideband Digital RF Receiver Front-End Employing a New Discrete-Time Filter for m-Wi-MAX," *IEEE J. Solid-State Circuits*, vol. 47, no. 5, pp. 1165-1174, May 2012, increasing filter order is done by cascading. In R. Bagheri et. al., "An 800-MHz-6-GHz Software-Defined Wireless Receiver in 90-nm CMOS," *IEEE J. Solid-State Circuits*, vol. 41, no. 12, pp. 2860-2875, December 2006, increasing filter order is done by increasing the number of coefficients. Both of these approaches result in significant increase in hardware complexity. As a consequence, chip area and cost of fabrication increases. In addition, the complex filter circuit comes with complex routings which bring increases in parasitic resistance and capacitance, which are not desired for high frequency/high accuracy filter design. The work of H. Seo et. al. and R. Bagheri et. al. is discussed in further detail below.

In H. Seo et. al., filter order is increased by cascading DT FIR filters. The first filter should be a non-decimation filter, because the sample rate should be maintained for the following filter to again perform identical filtering. Implementing the non-decimation filter results in a complex circuit (not shown, but see FIG. 9 of H. Seo et. al.). The total number of sampling units to implement 2nd order sinc filter $[1\ 1\ 1\ 1]^2$ is 40 for a single-ended signal, of which 32 sampling units are for implementing the non-decimation filter and 8 units are for implementing a decimation filter. If the tap number is generalized as N, the complexity in H. Seo et. al. is $$\text{Complexity in H. Seo et. al.} = 2 \times N^2 + 2 \times N \tag{1},$$

where the numeral "2" is related to interleaving. The complexity increases with 2nd order function of N.

Figure 4:
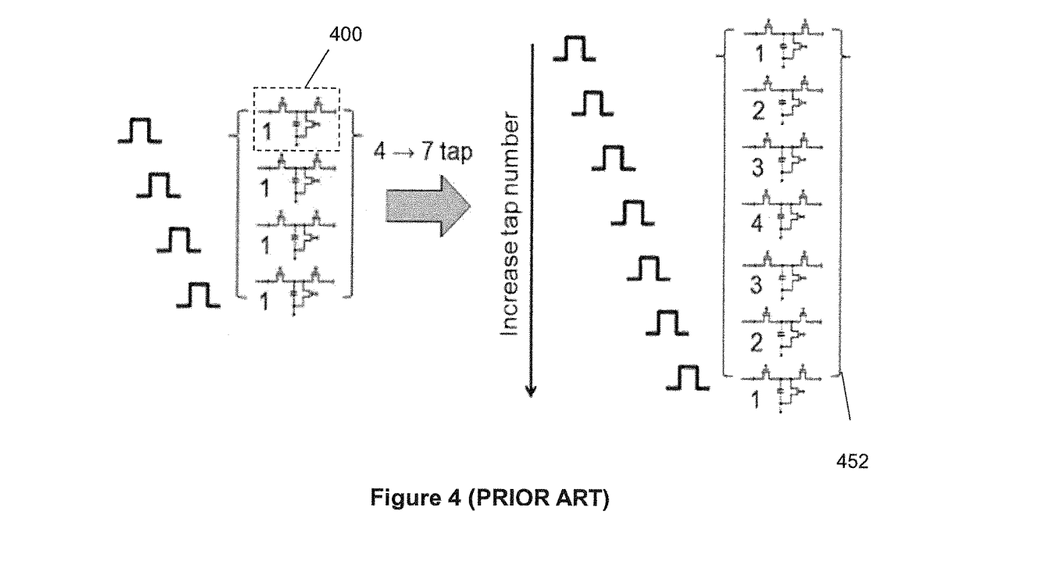
FIG. 4 shows a schematic of a prior art FIR filter, where filter tap is increased when the FIR filter realises a second order filter from a first order filter.

Instead of cascading, which results in 2nd order complexity, R. Bagheri et. al. increases the filter order by adding more filter tap. First, the 2nd order coefficient is unfolded as $$[1\ 1\ 1\ 1]^2 = [1\ 1\ 1\ 1]*[1\ 1\ 1\ 1] = [1\ 2\ 3\ 4\ 3\ 2\ 1] \tag{2},$$

where convolution (*) is used. Therefore, a 7 tap filter can replace cascaded non-decimation/decimation filters. If the tap number is generalized as N, the complexity for the approach used in R. Bagheri et. al. is $$\text{Complexity in R. Bagheri et. al.} = 2 \times (2 \times N - 1) \tag{3},$$

where the first numeral "2" is related to interleaving and the second numeral "2" is related to convolution. The complexity increases with 1st order function but the number of tap is doubled by the convolution. This increase in the number of tap can be visualized as shown in FIG. 4, in which 1st and 2nd order sinc diagrams of R. Bagheri et. al. are shown.

There is thus a need to provide an implementation method for DT FIR filters, whose filter order is increased without increasing the hardware complexity.

SUMMARY OF INVENTION

According to one aspect of the invention, there is provided a method of operating a finite impulse response filter comprising an input; an output; and a plurality of storage elements, each coupled to the input via a sample switch and to the output via a transfer switch, the method comprising: during charging of the plurality of storage elements, applying a sample clock signal to each of the sample switches that achieves an operation mode where up to every one of the sample switches is simultaneously closed to connect all of the plurality of storage elements to the input; and during averaging of the plurality of storage elements, applying a transfer clock signal to each of the transfer switches to close one or more of the transfer switches to connect the storage elements, having charge stored therein, to the output.

According to another aspect of the invention, there is provided a system comprising a finite impulse response filter comprising an input; an output; and a plurality of storage elements, each coupled to the input via a sample switch and to the output via a transfer switch, and a timing circuit configured to, during charging of the plurality of storage elements, apply a sample clock signal to each of the sample switches that achieves an operation mode where up to every one of the sample switches is simultaneously closed to connect all of the plurality of storage elements to the input; wherein the timing circuit is further configured to, during averaging of the plurality of storage elements, apply a transfer clock signal to each of the transfer switches to close one or more of the transfer switches to connect the storage elements, having charge stored therein, to the output.

BRIEF DESCRIPTION OF DRAWINGS

Example embodiments of the invention will be better understood and readily apparent to one of ordinary skill in the art from the following written description, by way of example only, and in conjunction with the drawings. The drawings are not necessarily to scale, emphasis instead generally being placed upon illustrating the principles of the invention, in which:

FIG. 8 compares the frequency response of the finite impulse response filter of

FIG. 7A and the frequency response of the second order finite impulse response filter of FIG. 4.

DESCRIPTION OF EMBODIMENTS

In the following description, various embodiments are described with reference to the drawings, where like reference characters generally refer to the same parts throughout the different views.

Figure 5:
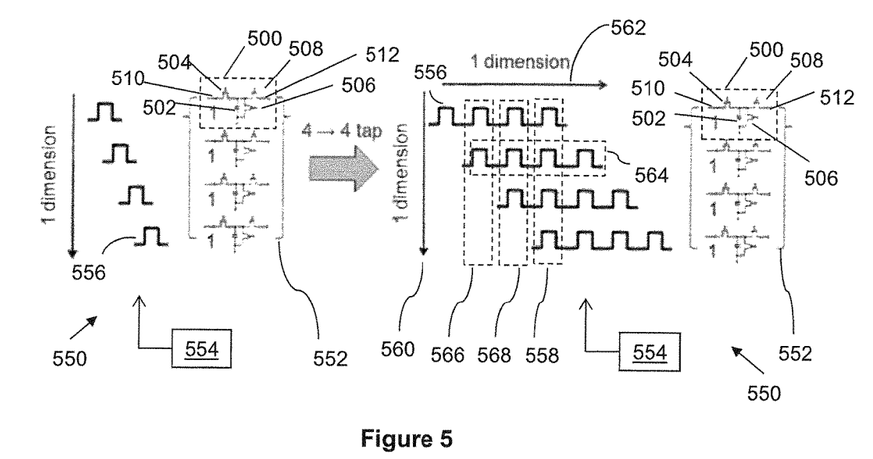
FIG. 5 shows a schematic of a system made in accordance with one embodiment of the present invention.

FIG. 5 shows a schematic of a system 550 made in accordance with one embodiment of the present invention. The system 550 comprises a finite impulse response filter 552 and a timing circuit 554. The finite impulse response filter 552 comprises an input 510; an output 512; and a plurality of storage elements 502. Each storage element 502 is coupled to the input 510 via a sample switch 504 and to the output 512 via a transfer switch 508. The finite impulse response filter 552 further comprises a reset switch 506 coupling each of the plurality of storage elements 502 to ground.

Each of the sample switch 504, the transfer switch 508 and the reset switch 506 is either in an open or close state, depending on an applied clock signal. When the applied clock signal is high, the sample switch 504, the transfer switch 508 and the reset switch 506 will close. When the applied clock signal is low, the sample switch 504, the transfer switch 508 and the reset switch 506 will open.

Each storage element 502 and its respectively coupled switches 504, 506 and 508 provide a sampling unit 500. The finite impulse response filter 552 thus comprises a plurality of such sampling units 500. Each of the sampling units 500 is similar to the sampling unit 200 shown in FIG. 2, in that the sampling unit 200 of FIG. 2 also comprises one capacitor/storage element 202 and at least three switches 204, 206 and 208.

The timing circuit 554 is configured to, during charging of the plurality of storage elements 502, apply a sample clock signal 556 to each of the sample switches 504. This charging of the plurality of storage elements 502 during the sample phase is also known as sampling of the plurality of storage elements 502. The timing circuit 554 is configured to provide one of the sample clock signals 556 to one of the sample switches 504; and provide another of the sample clock signals 556 to another of the sample switches 504, so that an operation mode is achieved where up to every one of the sample switches 504 is simultaneously closed. During such an operation mode, up to every one of the sample switches 504 is simultaneously closed to connect all of the plurality of storage elements 502 to the input. In one implementation, the operation mode comprises the simultaneous closure of all of the sample switches.

Figure 6:
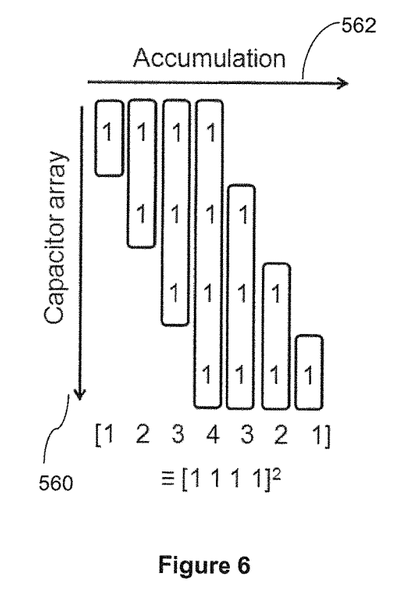
FIG. 6 shows the summation of charges stored in the system of FIG. 5, which results in a 2nd order filter.

By allowing closure of up to every one of the sample switches 504 (or the entire sample switches 504) to allow the storage elements 502 connected to the input 510 to sample an RF signal received at the input 510, the filter order of the finite impulse response filter 552 can be increased without increasing the number of sampling units 500. The embodiment shown in FIG. 5 can realize a second order filter, without increasing the number of sampling units 500. In comparison, the finite impulse response filter 452 shown in FIG. 4 requires three further sampling units 400 to provide the filter tap required to realise a second order filter. Instead of stretching a first dimension 560, through the addition of sampling units (which is utilised by the finite impulse response filter 452 shown in FIG. 4), the provision of the sample clock signals 556 to the finite impulse response filter 552 allows the utilisation of a second dimension 562, which is the time delay of the storage element 502 (which may be realised by a capacitor), as illustrated in FIG. 5. A two dimensional implementation method is thus achieved, which sees discrete time (DT) finite impulse response (FIR) filters utilising both charge sharing between sampling units 500 and charge accumulation in each sampling unit 500. The storage element 502 of each sampling unit 500 may accumulate charge from having the respectively coupled sample switch 504 being subject to four successive periods (denoted using reference numeral 564) of the sample clock signal 556 applied thereto. The initiation of the timing experienced by each sampling unit 500 is shifted from a preceding sampling unit 500. If all samples are added (i.e. the charge stored in each of the storage elements 502 is output and summed), the result will be equivalent to a 2nd order filter $[1\ 1\ 1\ 1]^2$ as shown in FIG. 6. Advantageously, the finite impulse response filter 552 maintains a complexity that is the same as a first order filter, Complexity of finite impulse response filter, in accordance with an embodiment of the invention $$=2 \times N \qquad (4)$$

which provides a circuit size that is about half that of, for example the finite impulse response filter 452 of FIG. 4, because the numeral "2" for convolution is removed. The implementation method is not limited to this $[1\ 1\ 1\ 1]^2$ example. Coefficients for each dimension 562, 560 can be chosen arbitrarily, and convolutions of their combinations are implementable, with several other examples provided below.

With reference to FIG. 6, the dimension 562 refers to charge accumulation in the unit 500. The other dimension 560 refers to the number of the units 500. In the $[1\ 1\ 1\ 1]^2$ example, four input samples are accumulated without any ratio multiplied to them. If the input samples are denoted as x[n], (nth input sample), the accumulated sample in the capacitor is $$y[n]=\underline{1}*x[n-3]+\underline{1}*x[n-2]+\underline{1}*x[n-1]+\underline{1}*x[n] \quad (5)$$

The underlined numbers correspond to the coefficient of this FIR operation, so as to obtain the case of a [1 1 1 1] coefficient for the accumulation dimension 562.

The final filter 552 output is generated by adding (averaging by charge sharing) the accumulated samples from 4 units 500, which have the same ratio. If the accumulated sample value in the nth sampling unit is denoted as y[n], the filter output will be $$z[n]=1*y[1]+1*y[2]+1*y[3]+1*y[4] \quad (6)$$

Similarly, [1 1 1 1] is the coefficient for the sampling unit dimension 560.

Consider a second example, where ratio is given to the input samples before accumulation (which may be implemented using a gain control V-I converter). The accumulated sample in the capacitor is $$y[n]=\underline{m1}*x[n-3]+\underline{m2}*x[n-2]+\underline{m3}*x[n-1]+\underline{m4}*x[n] \quad (7)$$

The underlined portions correspond to the coefficient of this FIR operation, so that the coefficient is now [m1 m2 m3 m4], for the accumulation dimension 562. Similarly, a different ratio can be given to the sampling units 500 (which is also possible by designing V-I converters to have different gain). Again, denoting the accumulated sample value in the nth sampling unit as y[n], the filter output will be $$z[n]=n1*y[1]+n2*y[2]+n3*y[3]+n4*y[4] \quad (8)$$

Then the coefficient is [n1 n2 n3 n4] for the sampling unit dimension. Then, by convolution, the filter 552 will have response of [m1 m2 m3 m4]*[n1 n2 n3 n4] (* is convolution).

Thus, not only ratio, but also the length of the coefficient vector can be varied. For example, if 3 samples are accumulated, instead of 4 samples, the coefficient for the accumulation dimension 562 will be changed from [1 1 1 1] to [1 1 1].

Figure 7A:
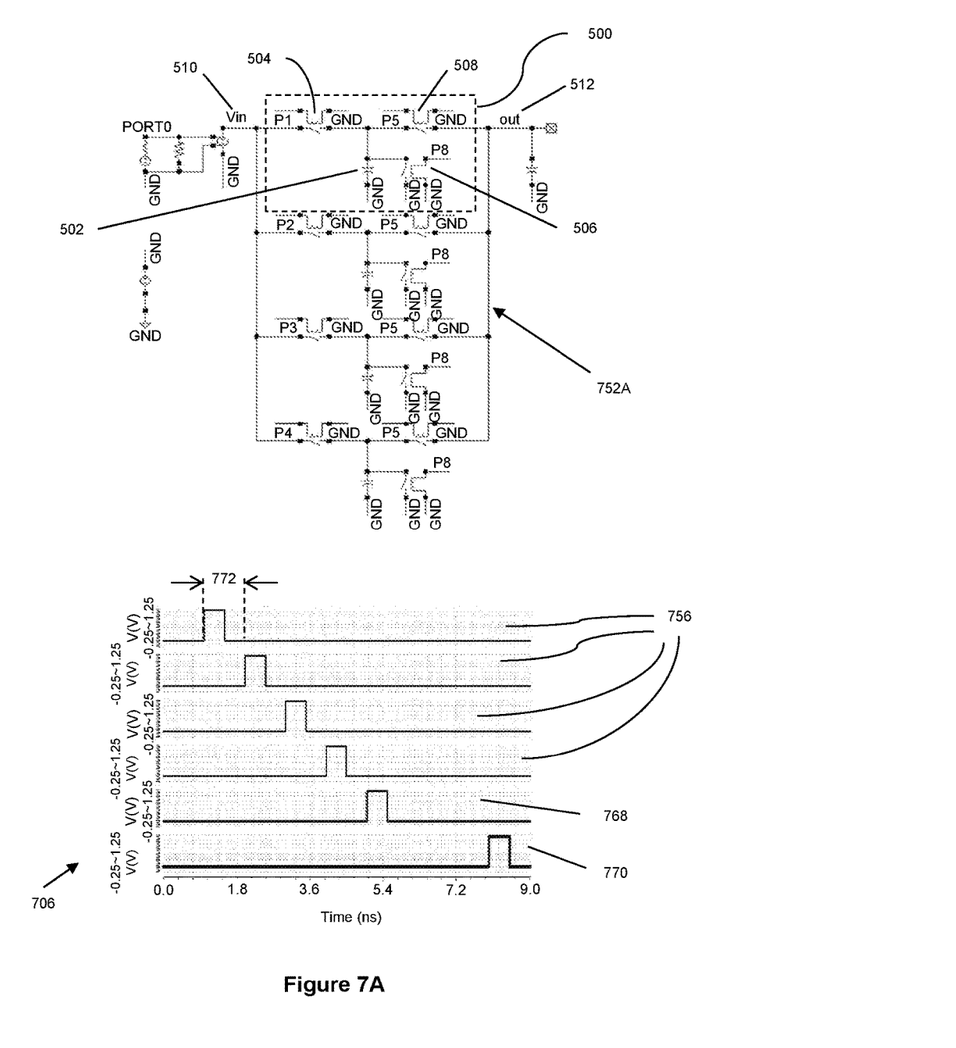
FIG. 7A shows a schematic of a generic finite impulse response filter which may be operated in accordance with one embodiment of the invention.

Returning to FIG. 5, the timing circuit 554 is further configured to, during averaging of the plurality of storage elements 502, apply a transfer clock signal 768 (see FIG. 7) to each of the transfer switches 508 to close one or more of the transfer switches 508 to connect the storage elements 502, having charge stored therein, to the output 512. The application of this transfer clock signal 768 allows the charge stored in each the storage elements 502, which are connected to the output 512, to be read. This averaging of the plurality of storage elements 502 during the transfer phase is also known as transferring or sharing of the charge stored in the plurality of storage elements 502. The timing circuit 554 is further configured to, during reset of the plurality of storage elements 502, apply a reset clock signal 770 to each of the reset switches 506 to close the reset switches 506 to connect the plurality of storage elements 502 to the ground. This reset of the plurality of storage elements 502 during the reset phase is also known as resetting or discharging of the plurality of storage elements 502.

FIG. 5 shows that there is an operation instance 558 where all of the sample switches 504 are closed. However, it is not essential for all of the sample switches 504 to be closed. The total number of sample switches 504, configured by the timing circuit 554 to close, may be determined by a filter order requirement of the finite impulse response filter 552. For instance, there may be an operation mode where only a total of two or three out of the four sample switches 504 may be closed to sample the input RF signal. This allows the finite impulse response filter 552 to be reconfigured to have different frequency response.

As explained above with reference to FIG. 6, having all of the sample switches 504 closed provides a coefficient [1 1 1 1] for the accumulation dimension 562. To change this coefficient to [1 1 0 1], the timing diagram will be, with reference to FIG. 6:

Unit 1: 1 1 0 1
Unit 2: 1 1 0 1
Unit 3: 1 1 0 1
Unit 4: 1 1 0 1 for a total: [1 2 2 3 2 2 1], which is the same as [1 1 0 1]*[1 1 1 1] (* is convolution). In this process, there is no timing or operation mode in which all the sample switches 504 are closed, which results in a different filter response compared to having all the sample switches 504 closed.

The timing circuit 554 may, in one configuration, only close the transfer switches 504 coupled to the storage elements 502 that store charge, i.e. the storage elements 502 that were connected to the input 510, via their respectively coupled closed sample switch 504, during the charging/sampling phase. Alternatively, the timing circuit 554 may further be configured to simultaneously close all of the transfer switches 504 during the averaging of the plurality of storage elements 502. This simultaneous closure may also apply for the transfer switches 504 which are connected to the storage elements 502 that were not connected to the input 510 during the charging/sampling phase.

The timing circuit 554 may be further configured to arrive at the operation mode of the simultaneous closure of up to every one of the sample switches 504 through progressive closure of each of the sample switches 504. For instance, before operation instance 566, only one of the sample switches 504 is closed. At operation instance 566, this increases to two of the sample switches 504; then to three of the sample switches 504 at operation instance 568; and finally all of the or the entire four sample switches 504 at the operation instance 558. Comparing the operation instances 568 and 566, the timing circuit 554 is configured to progressively close each of the sample switches 504 after a preceding sample switch 504 has been closed for at least one period of the sample clock signal 556 applied to the preceding sample switch 504. As an example, at the operation instance 566, one of the two sample switches 504 has already accumulated charge over a first period of the applied sample clock signal 556. During this operation instance 566, this sample switch 504 is accumulating charge for a consecutive second period while the other of the two sample switches 504 is accumulating charge over a first period of the applied sample clock signal 556.

FIG. 5 shows that the timing circuit 554 may be configured to have each of the plurality of storage elements 502 undergo charge accumulation up to a number of periods of the sample clock signal 556 that is equal to the number of the plurality of storage elements 502 in the finite impulse response filter 552, before undergoing the averaging. As shown in FIG. 5, the finite impulse response filter 552 has a total of four sampling units 500 for a total of four storage elements 502, whereby each of the four storage elements 502 undergoes charge accumulation that can span over a consecutive uninterrupted window of four periods of the respectively applied sample clock signal 556. After each of the storage elements 502 stores charge accumulated from subjecting the respectively coupled sample switch 504 to a total of four periods of the sample clock signal 556, the timing circuit 554 discontinues the application of the sample clock signal 556 to that sample switch 504, until the charge stored in the storage element 502 is extracted by the application of the transfer clock signal 768 to the transfer switch 508 coupled to the storage element 502. However, it is to be appreciated that the number of clock periods over which each of the storage elements 502 accumulate charge is independent of the sampling units 500 in the finite impulse response filter 552. Rather, the number of sampling units 500 that are activated or closed during the transfer phase may be arbitrarily chosen to achieve a desired coefficient for each dimension, such as to achieve the two examples described with reference to FIG. 6.

Further, as shown in FIG. 5, the timing circuit 554 is configured to provide the sample clock signals 556 in phase to one another. Providing the sample clock signals 556 in phase reduces the complexity of coordinating clock signal generation within the timing circuit 554 to provide the sample clock signals 556 required by the finite impulse response filter 552.

The timing circuit 554 may also comprise one or more oscillators (not shown for the sake of simplicity). By having the sample clock signals 556 in phase, they can be generated by a same oscillator of these one or more oscillators.

FIG. 7A shows a schematic of a generic finite impulse response filter 752A which may be operated in accordance with one embodiment of the invention. The finite impulse response filter 752A is a first order filter and is subject to a clocking scheme 706. For the sake of simplicity, the timing circuit that generates the clocking scheme 706 is not shown.

The finite impulse response filter 752A is similar to the finite impulse response filter 552 of FIG. 5 in that the finite impulse response filter 752A comprises an input 510; an output 512; and a plurality of storage elements 502. Each storage element 502 is coupled to the input 510 via a sample switch 504 and to the output 512 via a transfer switch 508. The finite impulse response filter 552 further comprises a reset switch 506 coupling each of the plurality of storage elements 502 to ground. Each storage element 502 and its respectively coupled switches 504, 506 and 508 provide a sampling unit 500. The finite impulse response filter 752A thus comprises a plurality of such sampling units 500.

The clocking scheme 706 comprises of sample clock signals 756, a transfer clock signal 768 and a reset clock signal 770. Similar to the finite impulse response filter 552A of FIG. 5, during charging of the storage elements 502, each of the sample clock signals 756 is applied to a respective one of the sample switches 504 to close the sample switch 504 and connect the coupled storage element 502 to the input 510. During averaging of the storage elements 502, the transfer clock signal 768 is applied to each of the transfer switches 508 to close one or more of the transfer switches 508 to connect the storage elements 502, having charge stored therein, to the output 512. During reset of the plurality of storage elements 502, the reset clock signal 770 is applied to each of the reset switches 506 to close the reset switches 506 to connect the plurality of storage elements 502 to the ground GND.

While the clocking scheme of FIG. 5 has each of its sample clock signals 556 provide four gating windows to a respective one of the sample switches 504, the clocking scheme 706 provides sample clock signals 756 that has only one gating window 772. This is because the timing circuit that generates the clocking scheme 706 has been configured to operate the finite impulse response filter 752A in a first order filter mode. However, the filter order of the finite impulse response filter 752A can be increased without changing its circuitry, by applying the clocking scheme shown in FIG. 5. The response of the finite impulse response filter 752A, when operated in a second order mode, is identical to the response of the second order filter shown in FIG. 4, as described below with reference to FIG. 8.

Figure 7B:
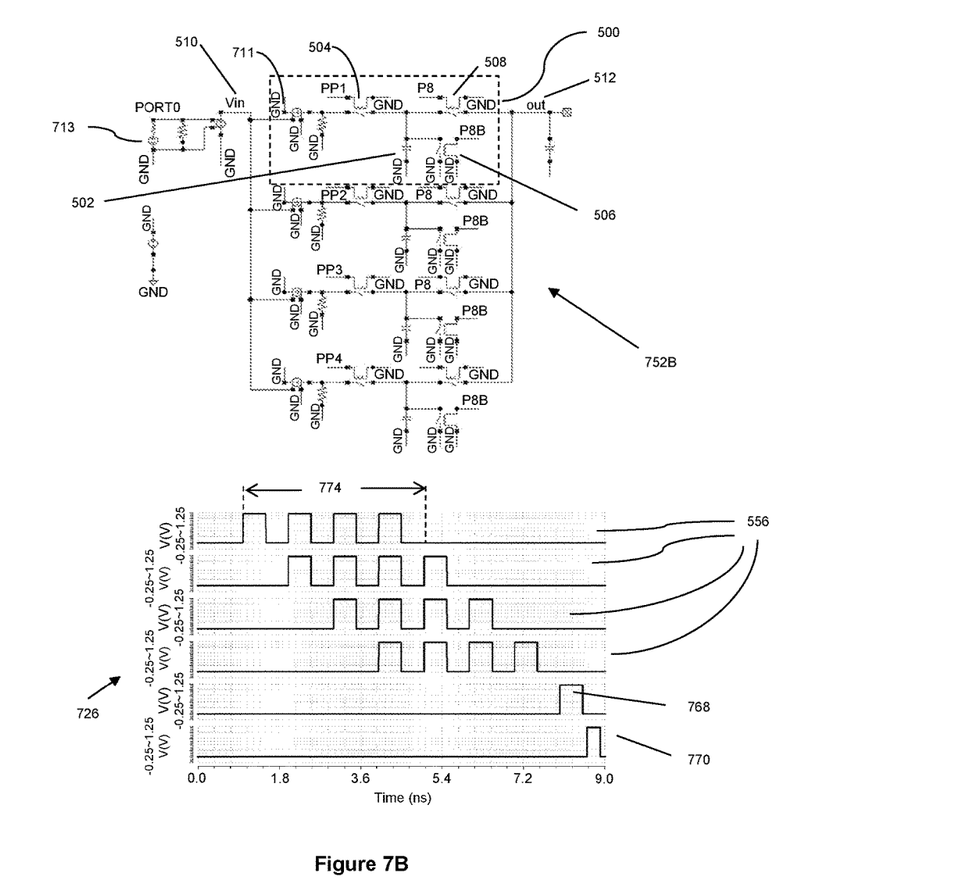
FIG. 7B shows a schematic of a finite impulse response filter which is built in accordance with one embodiment of the invention.

FIG. 7B shows a schematic of a finite impulse response filter 752B which is built in accordance with one embodiment of the invention. The finite impulse response filter 752B is a second order filter and is subject to a clocking scheme 726. For the sake of simplicity, the timing circuit that generates the clocking scheme 726 is not shown.

The finite impulse response filter 752B is similar to the finite impulse response filter 552A of FIG. 5 in that the finite impulse response filter 752B comprises an input 510; an output 512; and a plurality of storage elements 502. Each storage element 502 is coupled to the input 510 via a sample switch 504 and to the output 512 via a transfer switch 508. The finite impulse response filter 552 further comprises a reset switch 506 coupling each of the plurality of storage elements 502 to ground. Each storage element 502 and its respectively coupled switches 504, 506 and 508 provide a sampling unit 500. The finite impulse response filter 752A thus comprises a plurality of such sampling units 500.

The clocking scheme 726 comprises of sample clock signals 556, a transfer clock signal 768 and a reset clock signal 770. Similar to the finite impulse response filter 552A of FIG. 5, during charging of the storage elements 502, each of the sample clock signals 556 is applied to a respective one of the sample switches 504 to close the sample switch 504 and connect the coupled storage element 502 to the input 510. During averaging of the storage elements 502, the transfer clock signal 768 is applied to each of the transfer switches 508 to close one or more of the transfer switches 508 to connect the storage elements 502, having charge stored therein, to the output 512. During reset of the plurality of storage elements 502, the reset clock signal 770 is applied to each of the reset switches 506 to close the reset switches 506 to connect the plurality of storage elements 502 to the ground GND.

As the finite impulse response filter 752B is to be operated in a second order filter mode, the clocking scheme 726 is similar to that shown in FIG. 5. Thus, the finite impulse response filter 752B has an operation mode where up to every one of its sample switches 504 is simultaneously closed to connect all of the plurality of storage elements to the input 510. This clocking scheme 726 has each of its sample clock signals 556 provide up to four gating windows 774, in contrast to the clocking scheme 706 of FIG. 7A which has each of its sample clock signals 724 provide one gating window 772.

Compared to the finite impulse response filter 752A of FIG. 7A, the finite impulse response filter 752B of FIG. 7B has an isolation unit 711 that couples the sample switch 504 to the input 510. The isolation unit 711 controls the current flowing through the coupled sample switch 504 when closed by the applied sample clock signal 556. In the embodiment shown in FIG. 7B, the isolation unit 711 is a voltage dependent current source whose value depends on a voltage of an RF signal 713.

Figure 8:
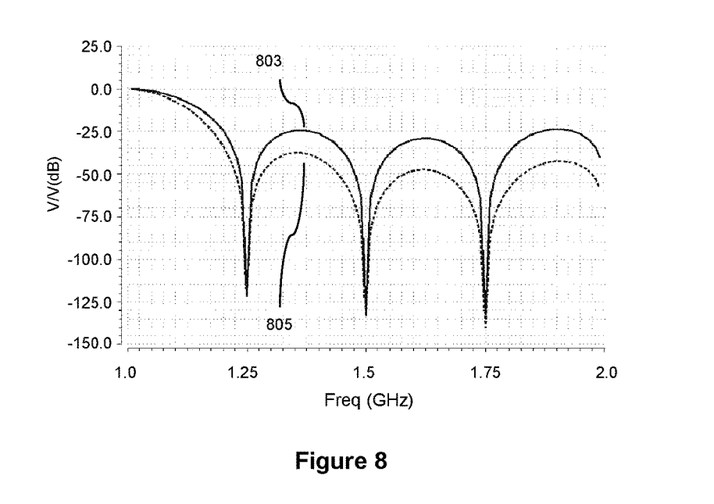

FIGS. 7A and 7B show that, in one implementation of the present invention, the filter order of a finite impulse response filter may be increased by changing the clocking scheme, without increasing the number of sampling units 500. There are four sampling units 500 in both the finite impulse response filter 752A of FIG. 7A and the finite impulse response filter 752B of FIG. 7B. With reference to FIG. 8, curve 803 shows the frequency response of the finite impulse response filter 752A of FIG. 7A, while curve 805 shows the frequency response of the second order response filter of FIG. 4.

Figure 9:
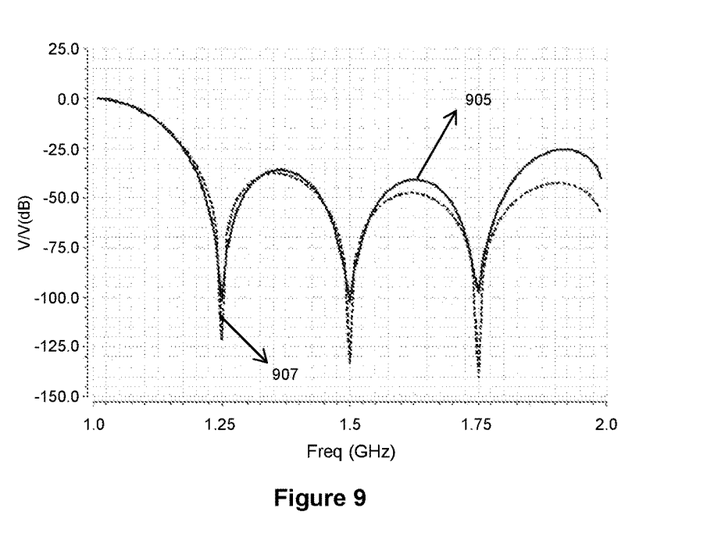
FIG. 9 compares the frequency response of the finite impulse response filter shown in FIG. 4 and the frequency response of a second order filter implemented by a finite impulse response filter in accordance with an embodiment of the present invention.

FIG. 9 compares the frequency response (dotted curve 907) of a second order filter implemented by a conventional approach, such as the finite impulse response filter 452 shown in FIG. 4, and the frequency response (solid curve 905) of a second order filter implemented by a finite impulse response filter in accordance with an embodiment of the present invention, such as the one shown in FIG. 7B. The differences in the high frequency (right-side) region are mainly due to different sampling methods. Voltage sampling is used in the finite impulse response filter 452 shown in FIG. 4, while charge sampling is used in a finite impulse response filter in accordance with an embodiment of the present invention. However, the FIR responses are same, in that both curves 905 and 907 have corresponding rejection bandwidth. The hardware complexity for implementing a second order filter in accordance with an embodiment of the present invention is only half that of the finite impulse response filter 452 shown in FIG. 4, whereas both have equivalent filtering effect.

From the above, various embodiments of the present invention provide a hardware-efficient implementation method for discrete-time (DT) finite impulse response (FIR) filters. Instead of increasing the number of sampling units, the filter utilises another dimension, which is the time delay of a sampling unit. This has the advantage of providing a DT filter that is smaller in area, which reduces fabrication cost and samples RF signals faster compared to a FIR filter that increases filter order by increasing the number of sampling units. The filter order in a FIR filter built in accordance with an embodiment of the present invention is then increased by a convolution effect, which is brought about when the charge stored in each of the storage elements 502 is extracted during transfer, from the closing of the transfer switch 508. Each of the plurality of storage elements 502 described above may comprise a capacitor.

Figure 10:
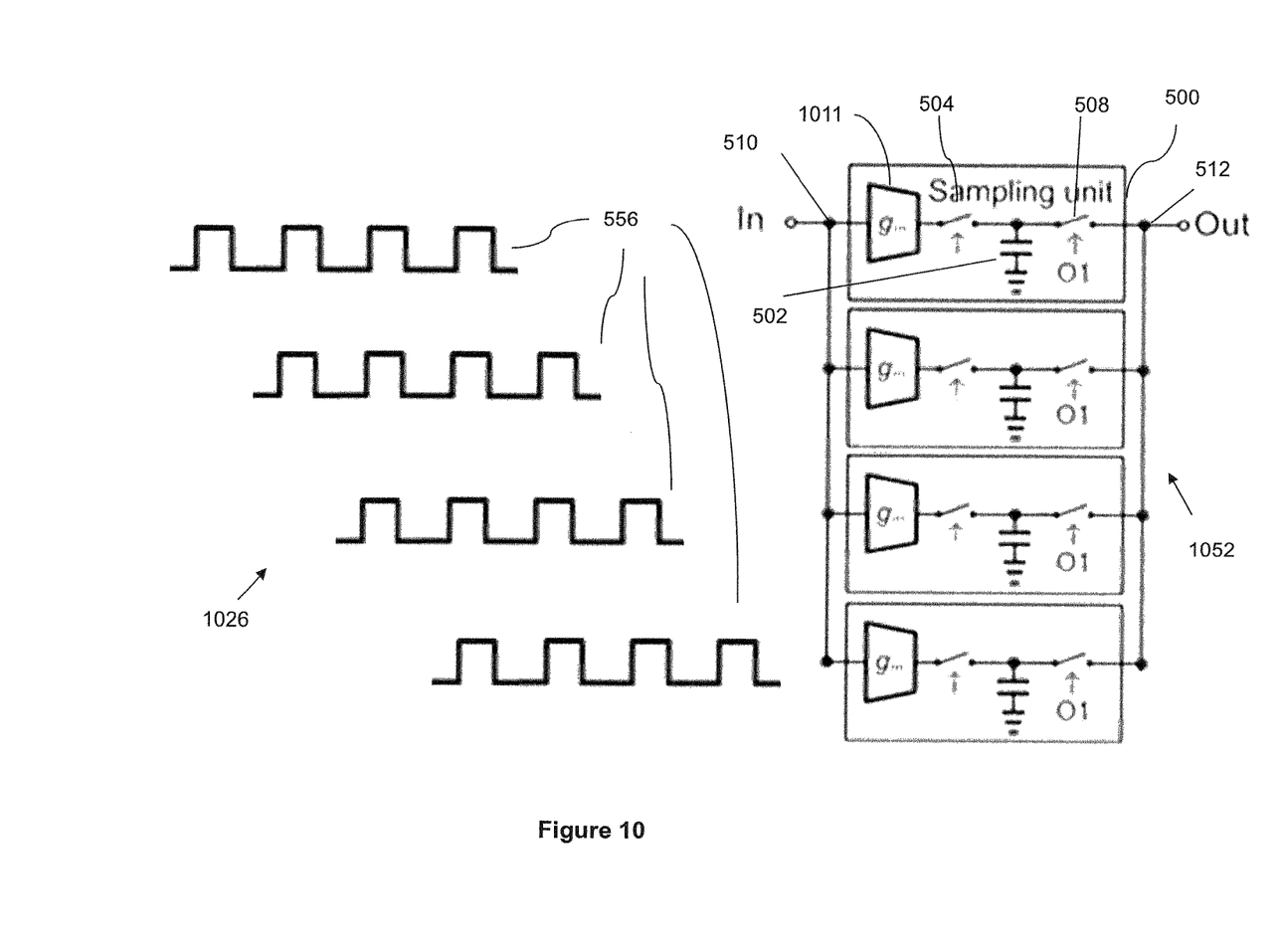
FIG. 10 shows a schematic of a finite impulse response filter, which is built in accordance with one embodiment of the invention, and a clocking scheme to which the finite impulse response filter is subjected.

FIG. 10 shows a schematic of a finite impulse response filter 1052, which is built in accordance with one embodiment of the invention, and a clocking scheme 1026 to which the finite impulse response filter 1052 is subjected. For the sake of simplicity, the timing circuit that generates the clocking scheme 1026 is not shown.

The finite impulse response filter 1052 is similar to the finite impulse response filter 752B of FIG. 7B in that the finite impulse response filter 752B comprises an input 510; an output 512; and a plurality of storage elements 502. Each storage element 502 is coupled to the input 510 via a sample switch 504 and to the output 512 via a transfer switch 508. The finite impulse response filter 552 further comprises a reset switch coupling each of the plurality of storage elements 502 to ground. However, for the sake of simplicity, the reset switch is not shown. Each storage element 502 and its respectively coupled switches 504 and 508 provide a sampling unit 500. The finite impulse response filter 1052 thus comprises a plurality of such sampling units 500.

The clocking scheme 1026 is similar to the clocking scheme 726 of FIG. 7B. However, only the sample clock signals 556 are shown, while the transfer clock signal and the reset clock signal are omitted. Similar to the finite impulse response filter 752B of FIG. 5, during charging of the storage elements 502, each of the sample clock signals 556 is applied to a respective one of the sample switches 504 to close the sample switch 504 and connect the coupled storage element 502 to the input 510. During averaging of the storage elements 502, the transfer clock signal is applied to each of the transfer switches 508 to close one or more of the transfer switches 508 to connect the storage elements 502, having charge stored therein, to the output 512. During reset of the plurality of storage elements 502, the reset clock signal is applied to each of the reset switches to close the reset switches to connect the plurality of storage elements 502 to the ground. The finite impulse response filter 1052 has an operation mode where up to every one of its sample switches 504 are simultaneously closed to connect all of the plurality of storage elements to the input 510.

Similar to the finite impulse response filters 552, 752A and 752B, the finite impulse response filter 1052 provides higher filter orders with smaller hardware, or more specifically, a fewer number of sampling units compared to the finite impulse response filter 452 shown in FIG. 4. As the area of a DT FIR filter is proportional to the number of its sampling units, the finite impulse response filter 752B will thus have a smaller size compared to the finite impulse response filter 452 shown in FIG. 4. Thus chip area is saved for a lower fabrication cost and a simple circuit enables higher operating frequency and sharper rejection. In addition, as DT FIR implementation requires complex circuitry, with many switches and clock signals, an increase in the number of sampling units (as in the case of the prior art of FIG. 4) will cause parasitic components to limit performance, such as speed or sharpness of rejection. Finite impulse response filters, made in accordance with the invention, solves this by achieving identical filter response with fewer number of sampling units.

Compared to, for example, the second order filter circuit shown in FIG. 4, the present invention requires isolation of the input current flowing into each sampling unit because multiple sampling units will be switching to sample an input signal. Thus, a trans-conductor is required in each sampling unit. Each sampling unit must be well-matched to another, because any mismatch will result in inaccurate FIR coefficients. So the isolation unit 1011 that provides the transconductor for each sampling unit 500 should be carefully designed. Since the accuracy of the charge sampling process is seriously affected by parasitic components at the transconductance output, the transconductance cell is split into each sampling unit 500, to shorten the routing between the trans-conductance and the sampling switch 504.

Figure 11:
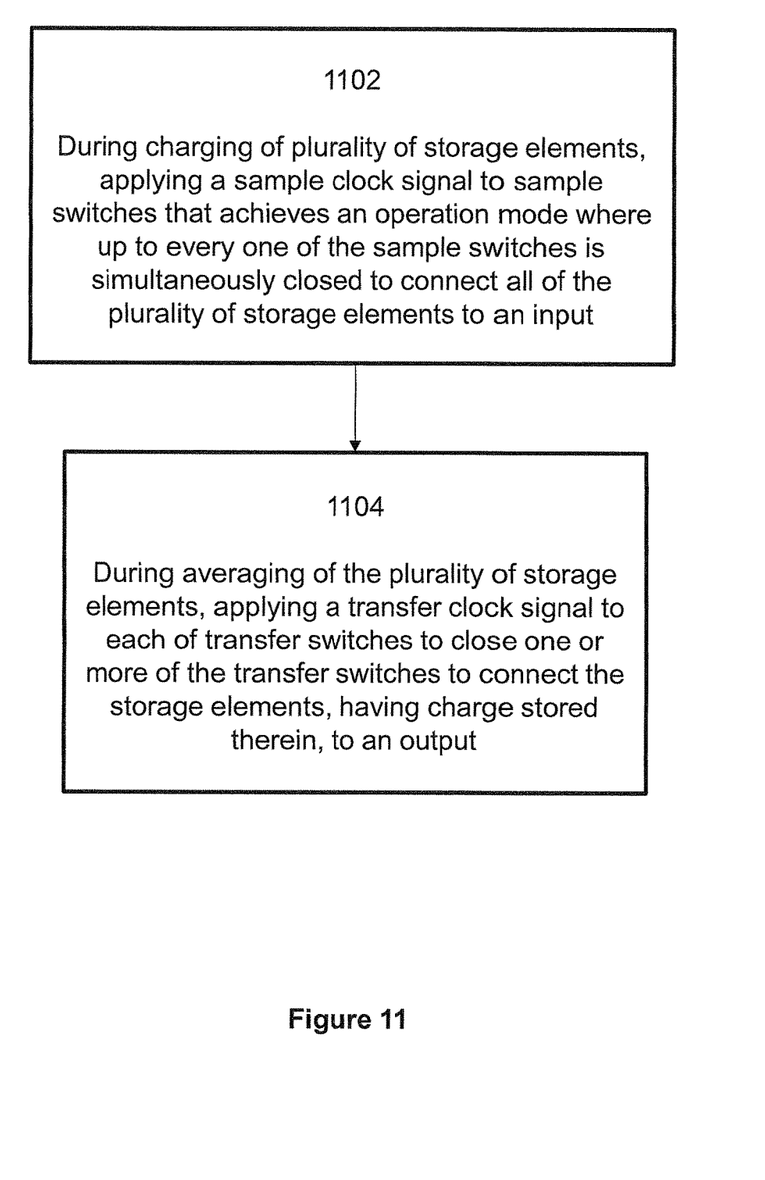
FIG. 11 shows a method, in accordance with one embodiment of the invention, of operating a finite impulse response filter.

The operation of the finite impulse response filters 552, 752A, 752B and 1052, shown in FIGS. 5, 7A, 7B and 10 may follow a methodology which follows a sequence shown in FIG. 11.

FIG. 11 shows a method 1100, in accordance with one embodiment of the invention, of operating a finite impulse response filter. The finite impulse response filter may be any one of those shown in FIGS. 5, 7A, 7B and 10, so that the finite impulse response filter comprises an input; an output; and a plurality of storage elements, each coupled to the input via a sample switch and to the output via a transfer switch. The finite impulse response filter further comprises a reset switch coupling each of the plurality of storage elements to ground.

The method 1100 comprises, in step 1102, charging of the plurality of storage elements. During this charging, a sample clock signal is applied to each of the sample switches that achieves an operation mode where up to every one of the sample switches is simultaneously closed to connect all of the plurality of storage elements to the input. The method 1100 comprises, in step 1102, averaging of the plurality of storage elements. During this averaging, a transfer clock signal is applied to each of the transfer switches to close one or more of the transfer switches to connect the storage elements, having charge stored therein, to the output.

In step 1102, the total number of sample switches that are closed may be determined by a filter order requirement of the finite impulse response filter. The operation mode of having up to every one of the sample switches simultaneously closed may be arrived at by progressively closing each of the sample switches. This operation mode comprises the simultaneous closure of all of the sample switches. Each of the sample switches may be progressively closed after a preceding sample switch has been closed for at least one period of the sample clock signal applied to the preceding sample switch.

In step 1102, each of the plurality of storage elements undergoes charge accumulation up to a number of periods of the sample clock signal that is equal to the number of the plurality of storage elements in the finite impulse response filter, before undergoing the averaging of step 1104. The sample clock signals may also be in phase. The sample clock signals may also be generated by the same oscillator.

In step 1104, all of the transfer switches may be simultaneously closed during the averaging of the plurality of storage elements.

Figure 12:
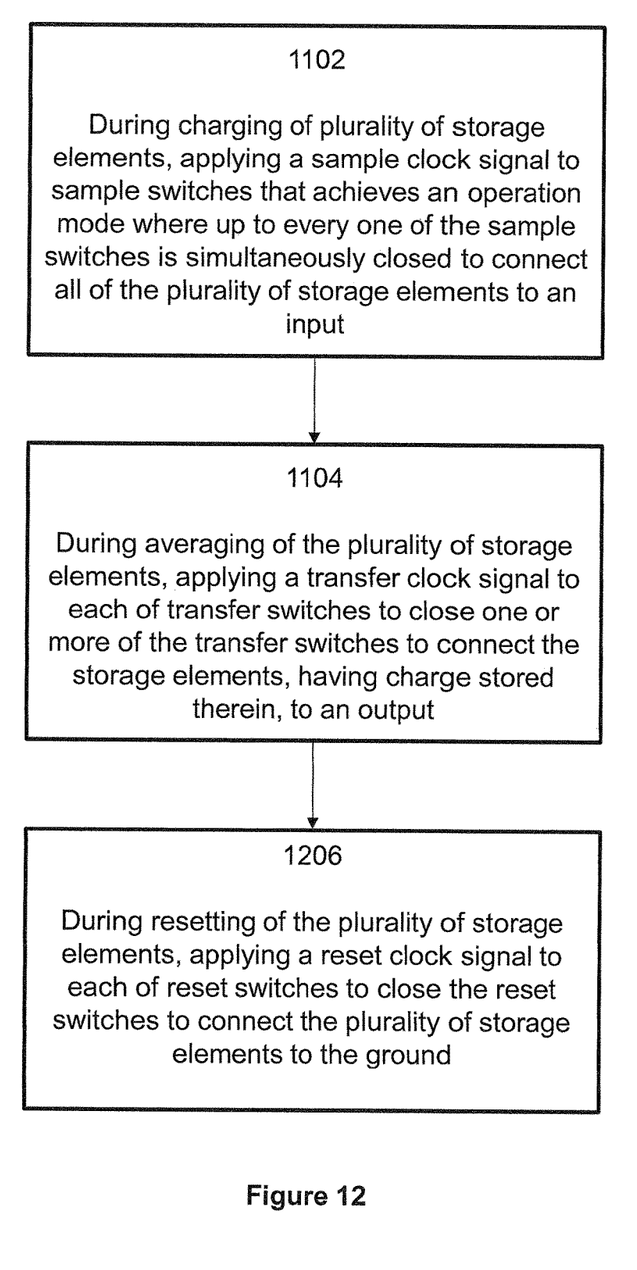
FIG. 12 shows a method which incorporates the steps of the method of FIG. 11.

FIG. 12 shows a method 1200 which incorporates the steps 1102 and 1104 of the method 1100 of FIG. 11. Compared to the method 1100 of FIG. 11, the method 1200 of FIG. 12 further comprises step 1206, resetting of the plurality of storage elements. During this resetting, a reset clock signal is applied to each of the reset switches to close the reset switches to connect the plurality of storage elements to the ground.

It will be appreciated by a person skilled in the art that numerous variations and/or modifications may be made to the present invention as shown in the embodiments without departing from a spirit or scope of the invention as broadly described. The embodiments are, therefore, to be considered in all respects to be illustrative and not restrictive.

The invention claimed is:

1. A method of operating a finite impulse response filter comprising an input; an output; and a plurality of storage elements each coupled to the input via a sample switch and to the output via a transfer switch, the method comprising:
   during charging of the plurality of storage elements, applying a sample clock signal to each of the sample switches that achieves an operation mode where up to every one of the sample switches is simultaneously closed to connect all of the plurality of storage elements to the input; and
   during averaging of the plurality of storage elements, applying a transfer clock signal to each of the transfer switches to close one or more of the transfer switches to connect the storage elements, having charge stored therein, to the output, wherein all the transfer switches are simultaneously closed during the averaging of the plurality of storage elements.

2. The method of claim 1, wherein the total number of sample switches that are closed is determined by a filter order requirement of the finite impulse response filter.

3. The method of claim 1, wherein the operation mode of having up to every one of the sample switches simultaneously closed is arrived at by progressively closing each of the sample switches.

4. The method of claim 3, wherein each of the sample switches is progressively closed after a preceding sample switch has been closed for at least one period of the sample clock signal applied to the preceding sample switch.

5. The method of claim 1, wherein the operation mode comprises the simultaneous closure of all of the sample switches.

6. The method of claim 1, wherein the sample clock signals are in phase.

7. The method of claim 1, wherein the finite impulse response filter further comprises a reset switch coupling each of the plurality of storage elements to ground, wherein the method further comprises:
   during resetting of the plurality of storage elements, applying a reset clock signal to each of the reset switches to close the reset switches to connect the plurality of storage elements to the ground.

8. The method of claim 1, wherein the sample clock signals are generated by the same oscillator.

9. A system comprising:
   a finite impulse response filter comprising:
      an input;
      an output; and
      a plurality of storage elements, each coupled to the input via a sample switch and to the output via a transfer switch; and
   a timing circuit configured to, during charging of the plurality of storage elements, apply a sample clock signal to each of the sample switches that achieves an operation mode where up to every one of the sample switches is simultaneously closed to connect all of the plurality of storage elements to the input; wherein the timing circuit is further configured to, during averaging of the plurality of storage elements, apply a transfer clock signal to each of the transfer switches to close one or more of the transfer switches to connect the storage elements, having charge stored therein, to the output, and wherein the timing circuit is configured to simultaneously close all the transfer switches during the averaging of the plurality of storage elements.

10. The system of claim 9, wherein the total number of sample switches, configured by the timing circuit to close, is determined by a filter order requirement of the finite impulse response filter.

11. The system of claim 9, wherein the timing circuit is configured to arrive at the operation mode of the simultaneous closure of up to every one of the sample switches through progressive closure of each of the sample switches.

12. The system of claim 11, wherein the timing circuit is configured to progressively close each of the sample switches after a preceding sample switch has been closed for at least one period of the sample clock signal applied to the preceding sample switch.

13. The system of claim 9, wherein the operation mode comprises the simultaneous closure of all of the sample switches.

14. The system of claim 9, wherein the timing circuit is configured to provide the sample clock signals in phase.

15. The system of claim 9, wherein the finite impulse response filter further comprises a reset switch coupling each of the plurality of storage elements to ground, wherein the timing circuit is further configured to, during reset of the plurality of storage elements, apply a reset clock signal to each of the reset switches to close the reset switches to connect the plurality of storage elements to the ground.

16. The system of claim 9, wherein the sample clock signals are generated by the same oscillator of the timing circuit.

17. A method of operating a finite impulse response filter that includes an input, an output, and a plurality of storage elements each coupled to the input via a sample switch and to the output via a transfer switch, the method comprising:

applying, during charging of the plurality of storage elements, sample clock signals that progressively close each of the sample switches after a preceding sample switch has been closed for at least one period of a sample clock signal applied to the preceding sample switch in order to achieve an operating mode where up to every one of the sample switches is simultaneously closed to connect all the plurality of storage elements to the input, wherein the preceding sample switch accumulates charge for a consecutive second period while another one of the sample switches is accumulating charge over a first period of the sample clock signal; and applying, during averaging of the plurality of storage elements, a transfer clock signal to each of the transfer switches to close one or more of the transfer switches to connect the storage elements, having charge stored therein, to the output.

18. The method of claim 17, wherein all the transfer switches are simultaneously closed during the averaging of the plurality of storage elements.

\* \* \* \* \*